United States Patent
Consiglio et al.

(10) Patent No.: US 9,064,694 B2
(45) Date of Patent: Jun. 23, 2015

(54) NITRIDATION OF ATOMIC LAYER DEPOSITED HIGH-K DIELECTRICS USING TRISILYLAMINE

(71) Applicants: Tokyo Electron Limited, Tokyo (JP); Air Liquide America Corporation, Newark, DE (US)

(72) Inventors: Steven P Consiglio, Albany, NY (US); Robert D Clark, Livermore, CA (US); Christian Dussarrat, Wilmington, DE (US); Vincent Omarjee, Grenoble (FR); Venkat Pallem, Hockessin, DE (US); Glenn Kuchenbeiser, Newark, DE (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/941,429

(22) Filed: Jul. 12, 2013

(65) Prior Publication Data
US 2014/0017907 A1    Jan. 16, 2014

Related U.S. Application Data

(60) Provisional application No. 61/670,737, filed on Jul. 12, 2012.

(51) Int. Cl.
*H01L 21/02* (2006.01)
*H01L 21/469* (2006.01)
(Continued)

(52) U.S. Cl.
CPC .... *H01L 21/02181* (2013.01); *H01L 21/02189* (2013.01); *H01L 21/02194* (2013.01); *H01L 21/02148* (2013.01); *H01L 21/02159* (2013.01); *H01L 21/02161* (2013.01); *H01L 21/0228* (2013.01); *H01L 21/02326* (2013.01);
(Continued)

(58) Field of Classification Search
CPC ............... H01L 21/28202; H01L 21/22249; H01L 21/02614; H01L 27/10855; H01L 27/10876; H01L 27/10888; H01L 27/10894; H01L 27/10885; C23C 16/308; C23C 16/45529; C23C 16/45542
USPC ......... 438/775, 785, 763, 778, 791, 758, 240, 438/241, 270, 275, 287, 478, 3, 618, 622, 438/637, 639, 981; 427/248.1, 255.28, 427/255.393, 255.39; 257/324, 325, 326, 257/314, 298, 295, 296, 297, 349, 547, 620, 257/E21.423, E21.006, E21.09, E21.19, 257/E21.17, E21.268, E21.269, E21.409, 257/E21.584
See application file for complete search history.

(56) References Cited

U.S. PATENT DOCUMENTS 7,192,626 B2   3/2007   Dussarrat et al.
7,427,572 B2   9/2008   Hasebe et al.
(Continued)

*Primary Examiner* — Chuong A Luu
*Assistant Examiner* — Moazzam Hossain

(57) ABSTRACT

A method is provided for forming a nitrided high-k film in an atomic layer deposition process (ALD) process. The method includes receiving a substrate in a process chamber, maintaining the substrate at a temperature sufficient for ALD of a nitrided high-k film, and depositing the nitrided high-k film on the substrate by exposing the substrate to a gas pulse sequence that includes, in any order: a) exposing the substrate to a gas pulse comprising a metal-containing precursor, b) exposing the substrate to a gas pulse comprising an oxygen-containing gas, and c) exposing the substrate to a gas pulse comprising trisilylamine gas, where the exposing the substrate to the trisilylamine gas yields the nitrided high-k film that includes nitrogen and that is substantially free of silicon, and repeating the gas pulse sequence. A trisilylamine gas exposure may also be used to nitride a deposited high-k film.

16 Claims, 6 Drawing Sheets

(51) Int. Cl.
*C23C 16/00* (2006.01)
*C23C 16/30* (2006.01)
*C23C 16/455* (2006.01)
*H01L 21/28* (2006.01)
*H01L 29/51* (2006.01)

(52) U.S. Cl.
CPC .... *H01L21/02332* (2013.01); *H01L 21/02337* (2013.01); *C23C 16/308* (2013.01); *C23C 16/45531* (2013.01); *H01L 21/28194* (2013.01); *H01L 29/518* (2013.01)

(56) References Cited

U.S. PATENT DOCUMENTS

| | | | |
|---|---|---|---|
| 7,473,655 | B2 | 1/2009 | Want et al. |
| 7,482,286 | B2 | 1/2009 | Misra et al. |
| 2003/0068869 | A1* | 4/2003 | Todd ............................. 438/398 |
| 2007/0031598 | A1 | 2/2007 | Okuyama et al. |
| 2008/0079111 | A1* | 4/2008 | Clark ........................... 257/506 |
| 2008/0311760 | A1 | 12/2008 | Nodera et al. |
| 2009/0261444 | A1* | 10/2009 | Yamazaki et al. ............ 257/459 |
| 2011/0086485 | A1* | 4/2011 | Endoh et al. .................. 438/287 |

* cited by examiner

NITRIDATION OF ATOMIC LAYER DEPOSITED HIGH-K DIELECTRICS USING TRISILYLAMINE

CROSS-REFERENCE TO RELATED APPLICATION

This application is related to and claims priority to U.S. Provisional application Ser. No. 61/670,737 filed on Jul. 12, 2012, the entire contents of which are herein incorporated by reference.

FIELD OF INVENTION

The present invention relates to the field of semiconductor manufacturing and more particularly to methods for forming nitrided high-k films for semiconductor devices.

BACKGROUND OF THE INVENTION

Recent advances in microelectronics have included the use of high-k films in gate dielectric stacks for logic applications. To increase device reliability and reduce electron leakage from the gate electrode to the transistor channel, semiconductor transistor technology is introducing high-k materials that allow increased physical thickness of the gate dielectric layer. Dielectric materials featuring a dielectric constant greater than that of $SiO_2$ (k~3.9) are commonly referred to as high-k materials. An early motivation for seeking high-k films for use in metal-oxide field effect transistors (MOSFETs) was one of simply reducing the leakage current without reducing the film capacitance. Furthermore, for many applications, the high-k films need to have the electrical equivalent of a $SiO_2$ layer having a physical thickness, $T_{ox}$, of about 1 nm.

Nitrogen incorporation into high-k films has been shown to improve many of the film properties for semiconductor devices, including increasing crystallization temperature, increasing the k value, and improving the barrier properties of the high-k films. However, incorporating nitrogen into the high-k films has turned out to be difficult and often requires the use of nitrogen-containing plasma that contain high energy charged species that can damage materials in the semiconductor device.

SUMMARY OF THE INVENTION

Embodiments of the invention provide methods for forming nitrided high-k films in an atomic layer deposition (ALD) process. The methods use trisilylamine ($N(SiH_3)_3$) gas exposures for effective nitrogen incorporation into a high-k film at low substrate temperatures.

According to an embodiment of the invention, a method is provided for forming a nitrided high-k film. The method includes receiving a substrate in a process chamber, and maintaining the substrate at a temperature sufficient for atomic layer deposition of the nitrided high-k film. The method further includes depositing the nitrided high-k film on the substrate by exposing the substrate to a gas pulse sequence that includes, in any order: a) exposing the substrate to a gas pulse comprising a metal-containing precursor, b) exposing the substrate to a gas pulse comprising an oxygen-containing gas, and c) exposing the substrate to a gas pulse comprising trisilylamine ($N(SiH_3)_3$) gas, where the exposing the substrate to the trisilylamine gas yields the nitrided high-k film that includes nitrogen and that is substantially free of silicon, and repeating the gas pulse sequence.

According to one embodiment of the invention, the method includes providing a substrate in a process chamber, and maintaining the substrate at a temperature sufficient for atomic layer deposition of the nitrided high-k film. The method further includes depositing the nitrided high-k film on the substrate by exposing the substrate to a gas pulse sequence that includes: a) exposing the substrate to a gas pulse comprising a metal-containing precursor, b) exposing the substrate to a gas pulse comprising an oxygen-containing gas, c) exposing the substrate to a gas pulse comprising trisilylamine ($N(SiH_3)_3$) gas, and d) exposing the substrate to a gas pulse comprising an oxygen-containing gas, where the exposing the substrate to the trisilylamine gas yields the nitrided high-k film than includes nitrogen and that is substantially free of silicon, and repeating the gas pulse sequence.

According to one embodiment of the invention, a method is provided for forming a nitrided high-k film. The method includes receiving a substrate in a process chamber, the substrate containing a high-k film thereon, and exposing the substrate to a gas pulse comprising a trisilylamine to yield a nitrided high-k film that includes nitrogen and that is substantially free of silicon.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Methods for forming nitrided high-k films are disclosed in various embodiments. The current inventors have discovered an ALD process that efficiently incorporates nitrogen into a high-k film at a low substrate temperature in absence of a plasma. The process utilizes trisilylamine as a source of nitrogen for the nitrided high-k film but the process does not incorporate silicon into the nitrided high-k film. This is unexpected since chemical vapor deposition (CVD) using trisilylamine at higher substrate temperature incorporates both nitrogen and silicon into the high-k film. Benefits of nitridation can include a higher dielectric constant and improved diffusion barrier properties of the nitrided high-k film. In comparison, the presence of silicon in high-k films and nitrided high-k films has been shown to reduce the dielectric constant of the films and, therefore, it can be advantageous to avoid or limit the amount of silicon in high-k films for many semiconductor devices.

One skilled in the relevant art will recognize that the various embodiments may be practiced without one or more of the specific details described herein, or with other replacement and/or additional methods, materials, or components. In other instances, well-known structures, materials, or operations are not shown or described in detail herein to avoid obscuring aspects of various embodiments of the invention. Similarly, for purposes of explanation, specific numbers, materials, and configurations are set forth herein in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention.

Figure 1:
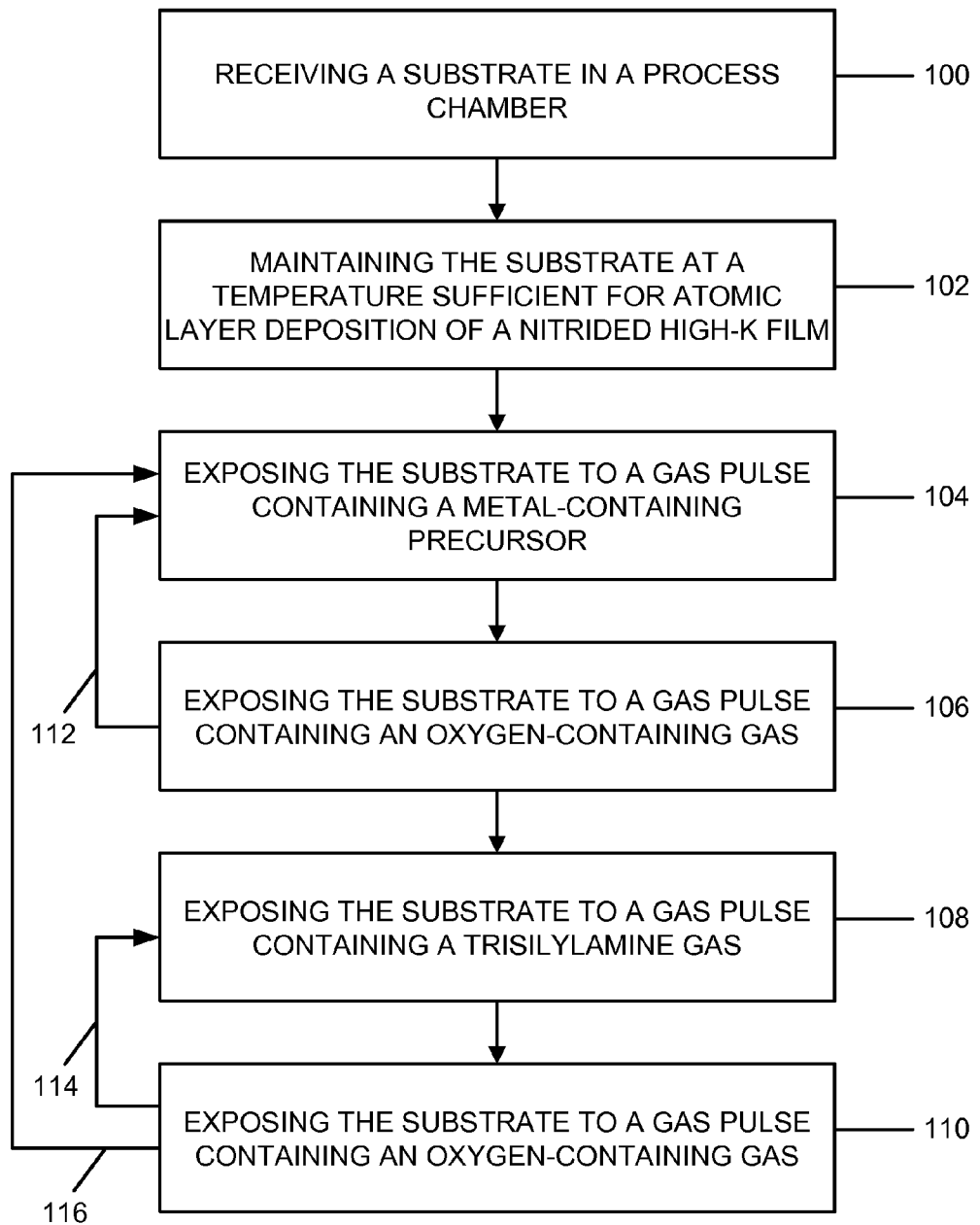
FIG. 1 is a process flow diagram for forming a nitrided high-k film according to an embodiment of the invention.

Referring now to the figures, FIG. 1 is a process flow diagram for forming a nitrided high-k film according to an embodiment of the invention, and FIGS. 2A-2E schematically show cross-sectional views of forming a nitrided high-k film according to the embodiment in FIG. 1.

In 100, a substrate 202 is received in a process chamber suitable for performing an ALD process. The substrate 202 can be of any type and size, for example a 200 mm silicon wafer, a 300 mm silicon wafer, a 450 mm silicon wafer, or an even larger silicon wafer. According to one embodiment, the substrate 202 can contain or consist of Si, for example crystalline Si, polycrystalline Si, or amorphous Si. In one example, the substrate 202 can be a tensile-strained Si layer. According to another embodiment, the substrate 202 may contain Ge or $Si_xGe_{1-x}$ compounds, where x is the atomic fraction of Si, 1−x is the atomic fraction of Ge, and 0<1−x<1. In one example, the substrate 202 can be a compressive-strained Ge layer or a tensile-strained $Si_xGe_{1-x}$ (x>0.5) deposited on a relaxed $Si_{0.5}Ge_{0.5}$ buffer layer. According to another embodiment, the substrate 202 can contain a semiconductor material other than Si, for example GaAs.

Figure 2A:
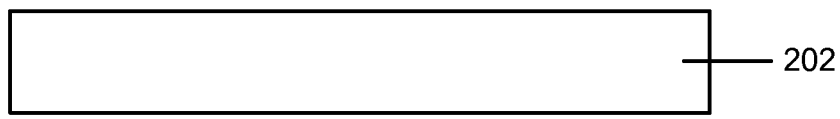
FIGS. 2A-2F schematically show cross-sectional views of forming a nitrided high-k film according to the embodiment in FIG. 1.

Although not shown in FIG. 2A, an interface layer may be present of the substrate 202. The interface layer can contain silicon oxide (e.g., $SiO_x$, where x is equal to or less than 2), silicon nitride, silicon oxynitride, or a combination thereof. In one example, the interface layer can contain high mobility, low defect $SiO_2$. The interface layer can have a thickness between about 5 angstrom and about 15 angstrom, between about 6 angstrom and about 10 angstrom, for example about 8 angstrom. The interface layer may be formed on a clean substrate 202. Cleaning of the substrate 202 may be performed in a liquid bath containing dilute hydrofluoric acid (HF) or, alternatively, by HF gas phase etching. The dilute HF liquid solution can be a $H_2O$:HF (e.g., a 50:1) mixture. Following the HF cleaning process, the substrate 202 may be rinsed in de-ionized (D.I.) water. The interface layer may contain a chemical oxide layer formed by oxidizing a surface of a monocrystalline silicon substrate 202 following removal of a native oxide layer. The chemical oxide layer may be formed in an aqueous bath containing deionized (DI) water and ozone ($O_3$), for example. The chemical oxide layer can be of high purity and can have a thickness between about 6 angstrom and about 15 angstrom. The chemical oxide layer passivates the underlying unoxidized portion of the monocrystalline silicon substrate 202 and forms a barrier to native oxide formation upon air exposure. Following formation of the chemical oxide layer, the substrate 202 is removed from the aqueous solution and dried, for example by a combination of isopropyl alcohol application and spin-drying. The presence of the chemical oxide layer on the substrate 202 limits buildup of atmospheric contaminants (e.g., organic contaminants) to the exposed surface of the chemical oxide layer upon transferring the substrate 100 from the aqueous solution to the processing chamber of a vacuum processing tool for further processing. According to other embodiments, a clean substrate 202 may be transferred to the process chamber and the interface layer formed in the process chamber.

In 102, the substrate is heated and maintained at a temperature in a temperature range sufficient for ALD of a nitrided high-k film. The temperature range sufficient for ALD is characterized by a self-limiting precursor adsorption regime where of the order of one monolayer of a metal-containing precursor is adsorbed on the substrate surface, thereby saturating the surface and preventing further adsorption of the metal-containing precursor onto the substrate surface. The adsorbed layer contains a partially decomposed metal-containing precursor where one or more ligands have been removed from the metal-containing precursor. For comparison, at substrate temperatures above the temperature range sufficient for ALD, the metal-containing precursor thermally decomposes further on the substrate surface and the film deposition rate is proportional to the duration of the gas exposure of the substrate surface to the metal-containing precursor. Those skilled in the art will readily realize that the temperature range sufficient for ALD can be different for different nitrided high-k films.

In general, the nitrided high-k film can include a metal-containing oxynitride film (MON) or a metal- and silicon-containing oxynitride film (MSiON). The nitrided high-k film may contain a metal (M) selected from the Periodic Table of the Elements that is capable of forming a high-k film. The metal can, for example, include hafnium (Hf), zirconium (Zr), titanium (Ti), aluminum (Al), an alkaline earth metal (beryllium (Be), magnesium (Mg), calcium (Ca), strontium (Sr), and barium (Ba)), a rare earth metal, or a combination thereof. The rare earth metal can include yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb), or any combinations of two or more thereof.

In one example, the nitrided high-k film can include hafnium oxynitride (HfON) that may be deposited by ALD using a hafnium source comprising $Hf(NEt_2)_4$ (tetrakis(diethylamido)hafnium, TDEAH). The high volatility and thermal stability of TDEAH allows for easy transportation from an evaporator source to a process chamber. The temperature range that is suitable for ALD of a nitrided high-k film using TDEAH is between about 100° C. and about 400° C., or more preferably between about 200° C. and about 350° C.

In other examples, the nitrided high-k film can include hafnium silicon oxynitride (HfSiON), zirconium oxynitride (ZrON), zirconium silicon oxynitride (ZrSiON), hafnium zirconium oxynitride (HfZrON), or hafnium zirconium silicon oxynitride (HfZrSiON).

Figure 2B:
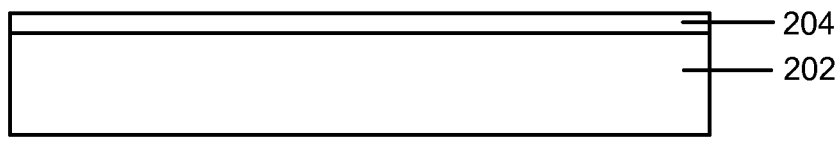

In 104, the substrate is exposed to a gas pulse containing a metal-containing precursor. The length of the gas pulse may be chosen to provide a saturation amount of the metal-containing precursor to the substrate surface. In FIG. 2B, the gas pulse containing the metal-containing precursor forms an adsorbed layer 204 on the substrate 202. The adsorbed layer 204 contains a partially decomposed metal-containing precursor.

Embodiments of the invention may utilize a wide variety of metal-containing precursors. For example, representative examples of hafnium and zirconium precursors include Hf(O$^t$Bu)$_4$ (hafnium tert-butoxide, HTB), Hf(NEt$_2$)$_4$ (tetrakis(diethylamido)hafnium, TDEAH), Hf(NEtMe)$_4$ (tetrakis(ethylmethylamido)hafnium, TEMAH), Hf(NMe$_2$)$_4$ (tetrakis(dimethylamido)hafnium, TDMAH), Zr(O$^t$Bu)$_4$ (zirconium tert-butoxide, ZTB), Zr(NEt$_2$)$_4$ (tetrakis(diethylamido)zirconium, TDEAZ), Zr(NMeEt)$_4$ (tetrakis(ethylmethylamido)zirconium, TEMAZ), Zr(NMe$_2$)$_4$ (tetrakis(dimethylamido)zirconium, TDMAZ), Hf(mmp)$_4$, Zr(mmp)$_4$, HfCl$_4$, ZrCl$_4$, ZrCp$_2$Me$_2$, Zr(tBuCp)$_2$Me$_2$, and Zr(NiPr$_2$)$_4$. In one example, the hafnium and zirconium precursors may have the same ligands (e.g., HTB and ZTB), thereby preventing any possible detrimental ligand exchange between the precursors.

Embodiments of the inventions may utilize a wide variety of different rare earth precursors. For example, many rare earth precursors have the formula:

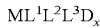

ML$^1$L$^2$L$^3$D$_x$ where M is a rare earth metal element selected from the group of yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). L$^1$, L$^2$, L$^3$ are individual anionic ligands, and D is a neutral donor ligand where x can be 0, 1, 2, or 3. Each L$^1$, L$^2$, L$^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclopentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentandionate, and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrrolidine, triethylamine, trimethylamine, acetonitrile, and 2,2-dimethylpropionitrile.

Representative examples of rare earth precursors include:

Y precursors: Y(N(SiMe$_3$)$_2$)$_3$, Y(N(iPr)$_2$)$_3$, Y(N(tBu)SiMe$_3$)$_3$, Y(TMPD)$_3$, Cp$_3$Y, (MeCp)$_3$Y, ((nPr)Cp)$_3$Y, ((nBu)Cp)$_3$Y, Y(OCMe$_2$CH$_2$NMe$_2$)$_3$, Y(THD)$_3$, Y[OOCCH(C$_2$H$_5$)C$_4$H$_9$]$_3$, Y(C$_{11}$H$_{19}$O$_2$)$_3$CH$_3$(OCH$_2$CH$_2$)$_3$OCH$_3$, Y(CF$_3$COCHCOCF$_3$)$_3$, Y(OOCC$_{10}$H$_7$)$_3$, Y(OOC$_{10}$H$_{19}$)$_3$, and Y(O(iPr))$_3$.

La precursors: La(N(SiMe$_3$)$_2$)$_3$, La(N(iPr)$_2$)$_3$, La(N(tBu)SiMe$_3$)$_3$, La(TMPD)$_3$, ((iPr)Cp)$_3$La, Cp$_3$La, Cp$_3$La(NCCH$_3$)$_2$, La(Me$_2$NC$_2$H$_4$Cp)$_3$, La(THD)$_3$, La[OOCCH(C$_2$H$_5$)C$_4$H$_9$]$_3$, La(C$_{11}$H$_{19}$O$_2$)$_3$.CH$_3$(OCH$_2$CH$_2$)$_3$OCH$_3$, La(C$_{11}$H$_{19}$O$_2$)$_3$.CH$_3$(OCH$_2$CH$_2$)$_4$OCH$_3$, La(O(iPr))$_3$, La(OEt)$_3$, La(acac)$_3$, La(((tBu)$_2$N)$_2$CMe)$_3$, La(((iPr)$_2$N)$_2$CMe)$_3$, La(((iPr)$_2$N)$_2$CH)$_3$, La(((tBu)$_2$N)$_2$C(tBu))$_3$, La(((iPr)$_2$N)$_2$C(tBu))$_3$, and La(FOD)$_3$.

Ce precursors: Ce(N(SiMe$_3$)$_2$)$_3$, Ce(N(iPr)$_2$)$_3$, Ce(N(tBu)SiMe$_3$)$_3$, Ce(TMPD)$_3$, Ce(FOD)$_3$, ((iPr)Cp)$_3$Ce, Cp$_3$Ce, Ce(Me$_4$Cp)$_3$, Ce(OCMe$_2$CH$_2$NMe$_2$)$_3$, Ce(THD)$_3$, Ce[OOCCH(C$_2$H$_5$)C$_4$H$_9$]$_3$, Ce(C$_{11}$H$_{19}$O$_2$)$_3$.CH$_3$(OCH$_2$CH$_2$)$_3$OCH$_3$, Ce(C$_{11}$H$_{19}$O$_2$)$_3$.CH$_3$(OCH$_2$CH$_2$)$_4$OCH$_3$, Ce(O(iPr))$_3$, and Ce(acac)$_3$.

Pr precursors: Pr(N(SiMe$_3$)$_2$)$_3$, ((iPr)Cp)$_3$Pr, Cp$_3$Pr, Pr(THD)$_3$, Pr(FOD)$_3$, (C$_5$Me$_4$H)$_3$Pr, Pr[OOCCH(C$_2$H$_5$)C$_4$H$_9$]$_3$, Pr(C$_{11}$H$_{19}$O$_2$)$_3$.CH$_3$(OCH$_2$CH$_2$)$_3$OCH$_3$, Pr(O(iPr))$_3$, Pr(acac)$_3$, Pr(hfac)$_3$, Pr(((tBu)$_2$N)$_2$CMe)$_3$, Pr(((iPr)$_2$N)$_2$CMe)$_3$, Pr(((tBu)$_2$N)$_2$C(tBu))$_3$, and Pr(((iPr)$_2$N)$_2$C(tBu))$_3$.

Nd precursors: Nd(N(SiMe$_3$)$_2$)$_3$, Nd(N(iPr)$_2$)$_3$, ((iPr)Cp)$_3$Nd, Cp$_3$Nd, (C$_5$Me$_4$H)$_3$Nd, Nd(THD)$_3$, Nd[OOCCH(C$_2$H$_5$)C$_4$H$_9$]$_3$, Nd(O(iPr))$_3$, Nd(acac)$_3$, Nd(hfac)$_3$, Nd(F$_3$CC(O)CHC(O)CH$_3$)$_3$, and Nd(FOD)$_3$.

Sm precursors: Sm(N(SiMe$_3$)$_2$)$_3$, ((iPr)Cp)$_3$Sm, Cp$_3$Sm, Sm(THD)$_3$, Sm[OOCCH(C$_2$H$_5$)C$_4$H$_9$]$_3$, Sm(O(iPr))$_3$, Sm(acac)$_3$, and (C$_5$Me$_5$)$_2$Sm.

Eu precursors: Eu(N(SiMe$_3$)$_2$)$_3$, ((iPr)Cp)$_3$Eu, Cp$_3$Eu, (Me$_4$Cp)$_3$Eu, Eu(THD)$_3$, Eu[OOCCH(C$_2$H$_5$)C$_4$H$_9$]$_3$, Eu(O(iPr))$_3$, Eu(acac)$_3$, and (C$_5$Me$_5$)$_2$Eu.

Gd precursors: Gd(N(SiMe$_3$)$_2$)$_3$, ((iPr)Cp)$_3$Gd, Cp$_3$Gd, Gd(THD)$_3$, Gd[OOCCH(C$_2$H$_5$)C$_4$H$_9$]$_3$, Gd(O(iPr))$_3$, and Gd(acac)$_3$.

Tb precursors: Tb(N(SiMe$_3$)$_2$)$_3$, ((iPr)Cp)$_3$Tb, Cp$_3$Tb, Tb(THD)$_3$, Tb[OOCCH(C$_2$H$_5$)C$_4$H$_9$]$_3$, Tb(O(iPr))$_3$, and Tb(acac)$_3$.

Dy precursors: Dy(N(SiMe$_3$)$_2$)$_3$, ((iPr)Cp)$_3$Dy, Cp$_3$Dy, Dy(THD)$_3$, Dy[OOCCH(C$_2$H$_5$)C$_4$H$_9$]$_3$, Dy(O(iPr))$_3$, Dy(O$_2$C(CH$_2$)$_6$CH$_3$)$_3$, and Dy(acac)$_3$.

Ho precursors: Ho(N(SiMe$_3$)$_2$)$_3$, ((iPr)Cp)$_3$Ho, Cp$_3$Ho, Ho(THD)$_3$, Ho[OOCCH(C$_2$H$_5$)C$_4$H$_9$]$_3$, Ho(O(iPr))$_3$, and Ho(acac)$_3$.

Er precursors: Er(N(SiMe$_3$)$_2$)$_3$, ((iPr)Cp)$_3$Er, ((nBu)Cp)$_3$Er, Cp$_3$Er, Er(THD)$_3$, Er[OOCCH(C$_2$H$_5$)C$_4$H$_9$]$_3$, Er(O(iPr))$_3$, and Er(acac)$_3$.

Tm precursors: Tm(N(SiMe$_3$)$_2$)$_3$, ((iPr)Cp)$_3$Tm, Cp$_3$Tm, Tm(THD)$_3$, Tm[OOCCH(C$_2$H$_5$)C$_4$H$_9$]$_3$, Tm(O(iPr))$_3$, and Tm(acac)$_3$.

Yb precursors: Yb(N(SiMe$_3$)$_2$)$_3$, Yb(N(iPr)$_2$)$_3$, ((iPr)Cp)$_3$Yb, Cp$_3$Yb, Yb(THD)$_3$, Yb[OOCCH(C$_2$H$_5$)C$_4$H$_9$]$_3$, Yb(O(iPr))$_3$, Yb(acac)$_3$, (C$_5$Me$_5$)$_2$Yb, Yb(hfac)$_3$, and Yb(FOD)$_3$.

Lu precursors: Lu(N(SiMe$_3$)$_2$)$_3$, ((iPr)Cp)$_3$Lu, Cp$_3$Lu, Lu(THD)$_3$, Lu[OOCCH(C$_2$H$_5$)C$_4$H$_9$]$_3$, Lu(O(iPr))$_3$, and Lu(acac)$_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide;

acac: acetylacetonate; hfac: hexafluoroacetylacetonate; and FOD: 6,6,7,7,8,8,8-heptafluoro-2,2-dimethyl-3,5-octanedionate.

Figure 2C:

Following the exposure in 104, a purge gas (e.g., Argon) can be used to purge the process chamber. Thereafter, in 106, the adsorbed layer 204 is exposed to a gas pulse of an oxygen-containing gas. In FIG. 2C, the gas pulse of the oxygen-containing gas reacts with the adsorbed layer 204 to form high-k film 206. The oxygen-containing gas exposure may be sufficient to saturate the reaction of the oxygen-containing gas with the adsorbed layer 204. The oxygen-containing gas can include, but is not limited to, $O_2$, water ($H_2O$), or peroxide ($H_2O_2$), or a combination thereof. The oxygen-containing gas may further include an inert gas such as Ar or $N_2$.

The exposure steps 104 and 106 may be repeated any number of times, as indicated by loop 112, in order to increase the thickness of the high-k film 206.

Figure 2D:
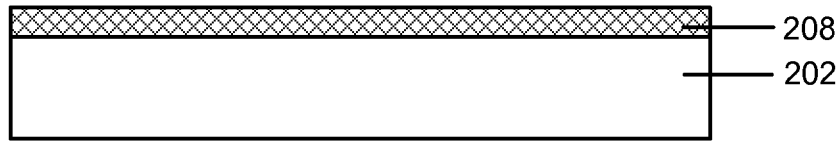

Following the exposure in 106, a purge gas (e.g., Argon) can be used to purge the process chamber. In 108, the high-k film 206 is exposed to a gas pulse containing a trisilylamine gas. In FIG. 2D, the gas pulse containing a trisilylamine gas reacts with the high-k film 206 to form nitrided high-k film 208. The gas exposure incorporates nitrogen, but not silicon, into the high-k film 206. The trisilylamine gas may further include an inert gas such as Ar or $N_2$. Trisilylamine gas ($N(SiH_3)_3$; TSA) is highly volatile and chlorine-free precursor with a vapor pressure of 315 Torr at 25° C. and a boiling point of 52° C. It is commercially available from American Air Liquide, Houston, Tex., USA.

Figure 2E:
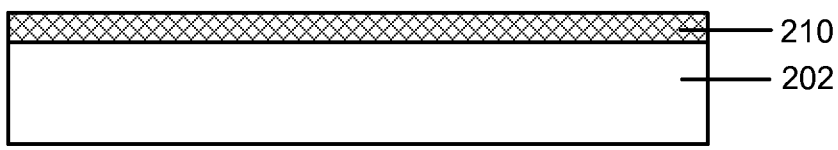

Following the exposure in 108, a purge gas (e.g., Argon) can be used to purge the process chamber. In 110, the nitrided high-k film 206 is exposed to a gas pulse of an oxygen-containing gas to incorporate additional oxygen and react with unsaturated adsorption sites in the nitrided high-k film 206. The resulting nitrided high-k film 208 is depicted in FIG. 2E. The gas pulse of the oxygen-containing gas may further aid in the removal silicon-containing ligands from the nitrided high-k film 206. The oxygen-containing gas can include, but is not limited to, $O_2$, water ($H_2O$), or peroxide ($H_2O_2$), or a combination thereof. The oxygen-containing gas may further include an inert gas such as Ar or $N_2$. Following the exposure in 110, a purge gas (e.g., Argon) can be used to purge the process chamber. According to one embodiment of the invention, the exposure step 110 may be omitted from the process flow in FIG. 1.

The exposure steps 108 and 110 may be repeated any number of times as indicated by loop 114, in order to increase the amount of nitrogen in the nitrided high-k film 210.

Figure 2F:
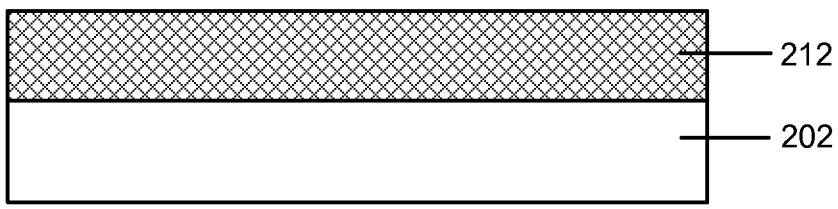

Further, the exposure steps 104, 106, 108, and 110 may be repeated any number of times as indicated by loop 116 in order to increase the thickness of the nitrided high-k film 210 and form a thick nitrided high-k film 212 as schematically shown in FIG. 2F. A thickness of nitrided high-k film 212 can, for example, be between about 5 angstrom and about 50 angstrom, between about 5 angstrom and about 30 angstrom, or between about 5 angstrom and about 20 angstrom.

Figure 3:
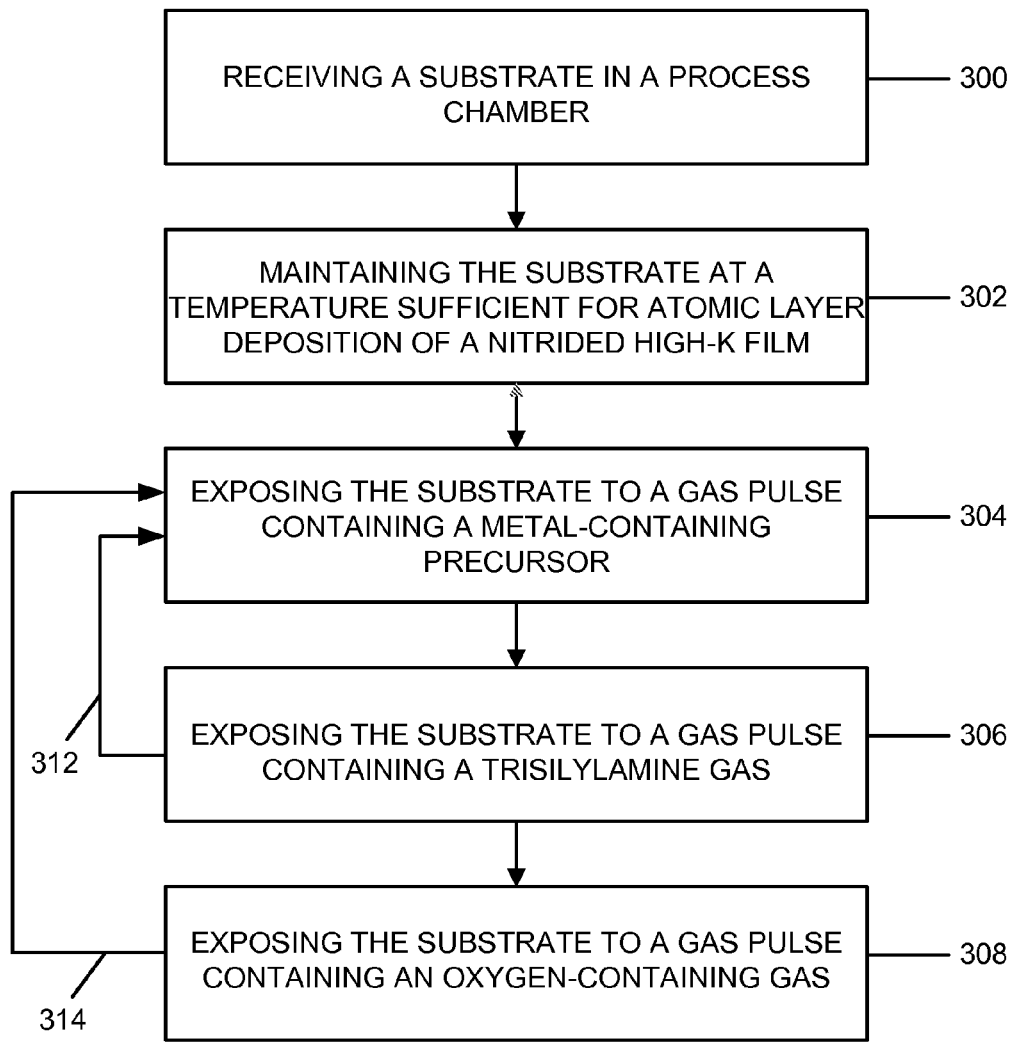
FIG. 3 is a process flow diagram for forming a nitrided high-k film according to an embodiment of the invention.

FIG. 3 is a process flow diagram for forming a nitrided high-k film according to an embodiment of the invention. The embodiment depicted in FIG. 3 is similar to the embodiment described above in FIGS. 1 and 2A-2F. For brevity, some of the details of same or similar processing steps, gases, and processing conditions will not be repeated here.

In 300, a substrate is received in a process chamber suitable for performing an ALD process and, in 302, the substrate is heated and maintained at a temperature in a temperature range sufficient for ALD of a nitrided high-k film.

In 304, the substrate is exposed to a gas pulse containing a metal-containing precursor to form an adsorbed layer on the substrate and, in 306, the adsorbed layer on the substrate is exposed to a gas pulse containing a trisilylamine gas to incorporate nitrogen, but not silicon, into the adsorbed layer and form a nitrided high-k film. In 308, the high-k film on the substrate is further exposed to a gas pulse of an oxygen-containing gas to incorporate oxygen into the nitrided high-k film. The exposure steps 304 and 306 may be repeated any number of times as indicated by loop 312, in order to increase the thickness of the high-k film. Similarly, the loop 314 may be repeated any number of times in order to increase the thickness of the high-k film.

Figure 4:
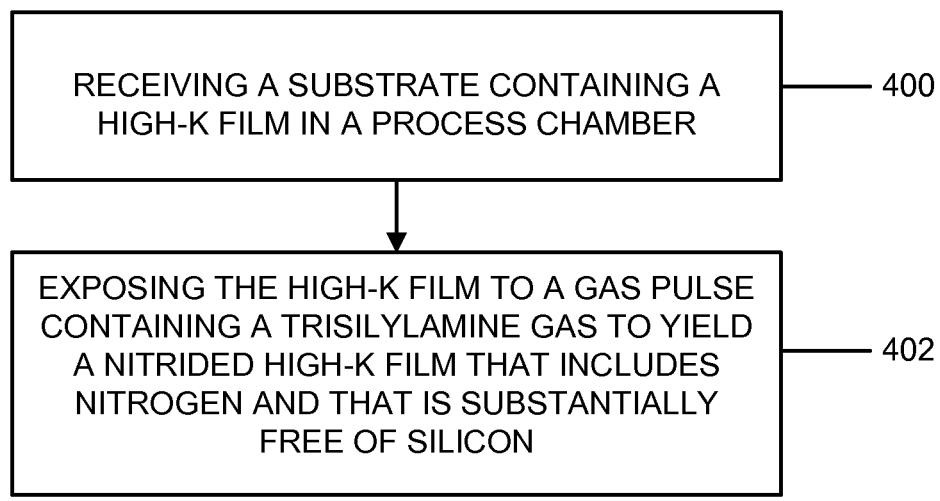
FIG. 4 is a process flow diagram for forming a nitrided high-k film according to an embodiment of the invention.
Figure 5A:
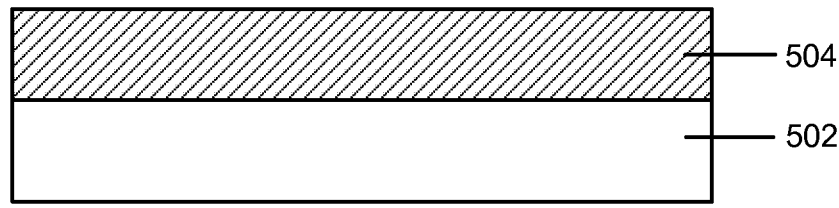
FIGS. 5A-5B schematically show cross-sectional views of forming a nitrided high-k film according to the embodiment in FIG. 4.
Figure 5B:
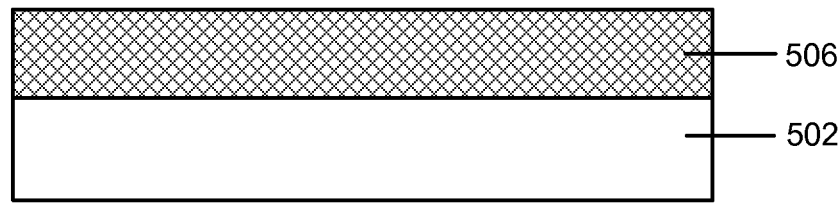

FIG. 4 is a process flow diagram for forming a nitrided high-k film according to an embodiment of the invention, and FIGS. 5A-5B schematically show cross-sectional views of forming a nitrided high-k film according to embodiment in FIG. 4. For brevity, since the embodiment depicted in FIG. 4 contains processing steps that are similar to the embodiment described above in FIG. 1, some of the details of same or similar processing steps, gases, and processing conditions will not be repeated here.

In 500, a substrate containing a high-k film is received in a process chamber and, in 502, the substrate is heated and maintained at a temperature in a temperature range sufficient for incorporating nitrogen into the high-k film. In one example, the temperature range may be sufficient for depositing the high-k film by ALD. In 504, the high-k film is exposed to a gas pulse containing a trisilylamine gas to incorporate nitrogen, but not silicon, into the high-k film. According to an embodiment of the invention, at least a portion of a thickness of high-k film may be nitrided using the gas exposure to the trisilylamine gas. As described above, benefits of such nitridation can include improved diffusion barrier properties and a higher dielectric constant of the nitrided high-k film. In general, the nitrided high-k film can include a metal-containing oxynitride film (MON) or a metal- and silicon-containing oxynitride film (MSiON). Examples of such films were described above.

Figure 6A:
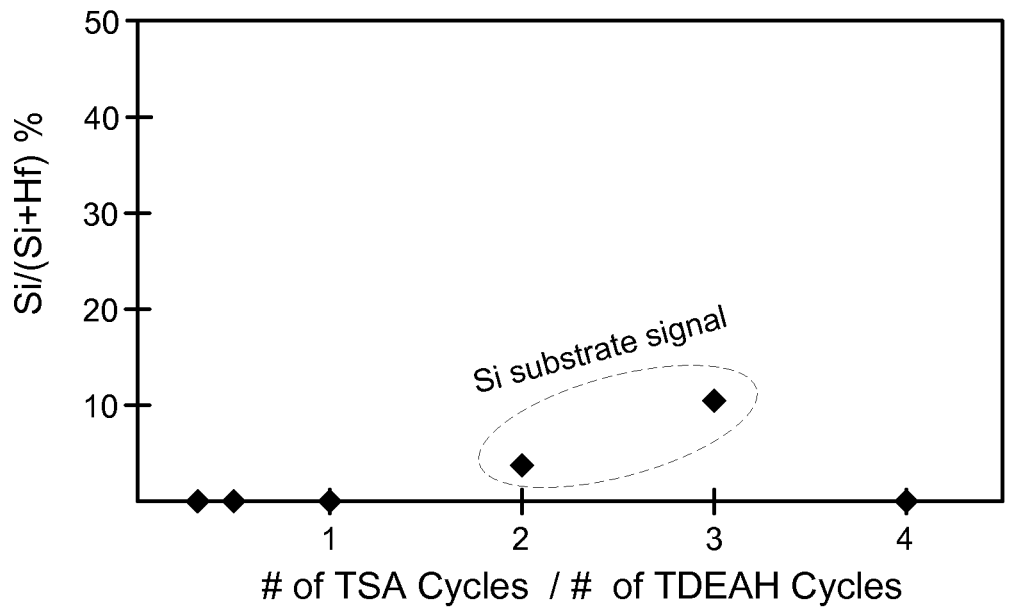
FIG. 6A shows Si/(Si+Hf) % as a function of # cycles TSA/# cycles of TDEAH for HfON film.

FIG. 6A shows Si/(Si+Hf) % as a function of # of TSA cycles/# of TDEAH cycles for HfON films. The HfON films were deposited on a Si substrate using the flow diagram in FIG. 1. The HfON film deposition was carried out in a cold wall process chamber at a substrate temperature between about 250° C. and about 300° C. and a process chamber pressure of about 1.5 Torr. The TDEAH was placed in a bubbler that was maintained at 75° C. to ensure proper delivery to the process chamber. The TSA and the $H_2O$ were placed in separate bubblers that were maintained at room temperature. Each TSA cycle included the following sequential exposure steps: gas pulse of TSA, gas pulse of a purge gas, gas pulse of $H_2O$ gas, and a gas pulse of a purge gas. Each TDEAH cycle included the following sequential exposure steps: gas pulse of TDEAH, gas pulse of a purge gas, gas pulse of $H_2O$ gas, and a gas pulse of a purge gas. The deposited HfON films had a thickness of at least 75 angstrom and were subjected to a 30 second argon plasma cleaning prior to X-ray Photoelectron Spectroscopy (XPS) analysis. It is estimated that the argon plasma cleaning removed film surface impurities and about 25 angstrom of the thickness of the HfON films. The XPS results in FIG. 6A show that substantially no Si is incorporated into the HfON films. The Si signals at # of TSA cycles/# of TDEAH cycles of 2 and 3 are thought to be due to the Si substrate and not from Si in the HfON films.

Figure 6B:
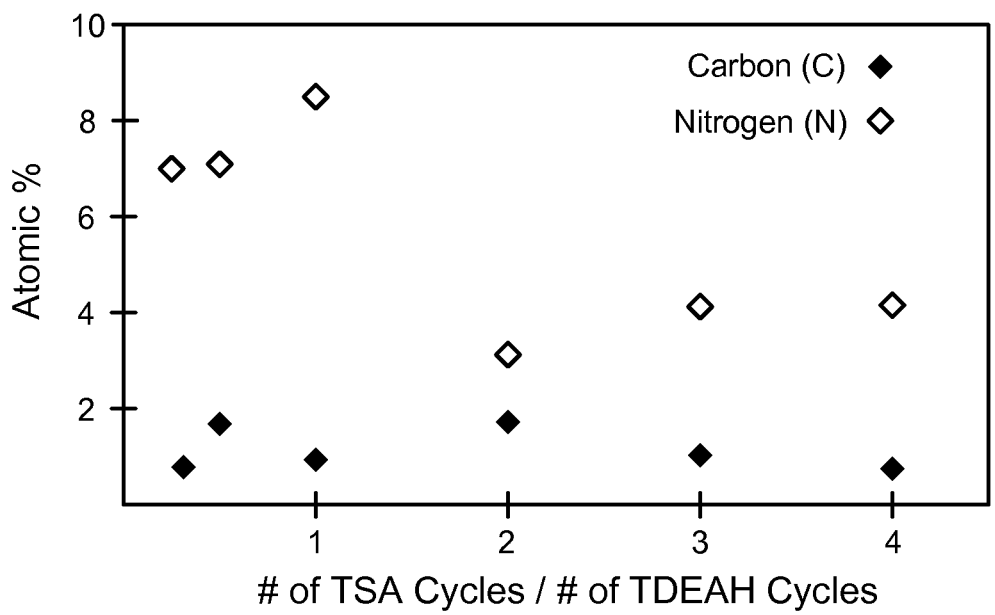
FIG. 6B shows the atomic percent of carbon and nitrogen as a function of # cycles TSA/# cycles of TDEAH for HfON films.

FIG. 6B shows the atomic percent of carbon and nitrogen as a function of # of TSA cycles/# of TDEAH cycles for HfON films. The XPS analysis in FIG. 6B was done on the same films as in FIG. 6A. The XPS signals in FIG. 6B show that the HfON films contain between about 3-9 atomic % N and less than 2 atomic % C. This shows that TSA is a very effective nitrating agent when used in an ALD process for forming nitrided high-k.

A plurality of embodiments for forming nitrided high-k films have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a nitrided high-k film, the method comprising:
   receiving a substrate in a process chamber;
   maintaining the substrate at a temperature sufficient for atomic layer deposition of a nitrided high-k film; and
   depositing the nitrided high-k film on the substrate by exposing the substrate to a gas pulse sequence that includes, in any order:
   a) exposing the substrate to a first gas pulse comprising a metal-containing precursor,
   b) exposing the substrate to a second gas pulse comprising an oxygen-containing gas, and
   c) exposing the substrate to a third gas pulse comprising trisilylamine $(N(SiH_3)_3)$ gas,
      wherein the exposing the substrate to the trisilylamine gas yields the nitrided high-k film that contains >3 atomic % N and <1 atomic % Si, and
   repeating the gas pulse sequence.

2. The method of claim 1, wherein depositing the nitrided high-k film includes depositing the nitrided high-k film that includes a metal oxide.

3. The method of claim 2, wherein the nitrided high-k film includes hafnium, zirconium, or both hafnium and zirconium.

4. The method of claim 3, wherein the nitrided high-k film is selected from the group consisting of HfON, ZrON and HfZrON.

5. The method of claim 1, further comprising
   d) exposing the substrate to a fourth gas pulse comprising a silicon-containing precursor that incorporated silicon into the nitrided high-k film, and wherein d) is repeated in the gas pulse sequence.

6. The method of claim 5, wherein the depositing the nitrided high-k film includes depositing the nitrided high-k film that includes a metal silicate.

7. The method of claim 5, wherein the nitrided high-k film includes HfSiON, ZrSiON, or HfZrSiON.

8. The method of claim 5, wherein the depositing the nitrided high-k film includes depositing the nitrided high-k film that contains >3 atomic % N.

9. A method of forming a nitrided high-k film, the method comprising:
   receiving a substrate in a process chamber;
   maintaining the substrate at a temperature sufficient for atomic layer deposition of a nitrided high-k film; and
   depositing the nitrided high-k film on the substrate by exposing the substrate to a gas pulse sequence that includes:
   a) exposing the substrate to a first gas pulse comprising a metal-containing precursor,
   b) exposing the substrate to a second gas pulse comprising an oxygen-containing gas,
   c) exposing the substrate to a third gas pulse comprising trisilylamine $(N(SiH_3)_3)$ gas, and
   d) exposing the substrate to a fourth gas pulse comprising an oxygen-containing gas,
   wherein the exposing the substrate to the trisilylamine gas yields the nitrided high-k film that contains >3 atomic % N and <1 atomic % Si, and
   repeating the gas pulse sequence.

10. The method of claim 9, wherein the nitrided high-k film includes hafnium, zirconium, or both hafnium and zirconium.

11. The method of claim 10, wherein the nitrided high-k film is selected from the group consisting of HfON, ZrON and HfZrON.

12. The method of claim 9, wherein the depositing the nitrided high-k film includes depositing the nitrided high-k film that is substantially free of Si.

13. A method of forming a nitrided high-k film, the method comprising:
   receiving a substrate in a process chamber, the substrate containing a high-k film thereon; and
   exposing the substrate to a gas pulse comprising a trisilylamine $(N(SiH_3)_3)$ gas to yield a nitrided high-k film that contains >3 atomic % N and <1 atomic % Si.

14. The method of claim 13, wherein the depositing the nitrided high-k film includes depositing the nitrided high-k film that includes a metal oxide.

15. The method of claim 14, wherein the nitrided high-k film includes hafnium, zirconium, or both hafnium and zirconium.

16. The method of claim 13, wherein the nitrided high-k film is selected from the group consisting of HfON, ZrON and HfZrON.

* * * * *

UNITED STATES PATENT AND TRADEMARK OFFICE
CERTIFICATE OF CORRECTION

| | | |
|---|---|---|
| PATENT NO. | : 9,064,694 B2 | |
| APPLICATION NO. | : 13/941429 | |
| DATED | : June 23, 2015 | |
| INVENTOR(S) | : Steven P. Consiglio et al. | |

It is certified that error appears in the above-identified patent and that said Letters Patent is hereby corrected as shown below:

On the title page, under item (73), the Assignees should read:

Tokyo Electron Limited, Tokyo (JP)
American Air Liquide, Inc., Freemont, CA (US)

Signed and Sealed this
Twenty-first Day of June, 2016

Michelle K. Lee
*Director of the United States Patent and Trademark Office*